United States Patent
Looby et al.

(10) Patent No.: US 9,935,452 B2
(45) Date of Patent: Apr. 3, 2018

(54) CIRCUITS AND TECHNIQUES FOR SIGNALING BETWEEN DEVICES

(71) Applicant: Allegro Microsystems, LLC, Worcester, MA (US)

(72) Inventors: Christy Looby, Edinburgh (GB); Robert D. Christie, Fife (GB)

(73) Assignee: Allegro MicroSystems, LLC, Worcester, MA (US)

( * ) Notice: Subject to any disclaimer, the term of this patent is extended or adjusted under 35 U.S.C. 154(b) by 241 days.

(21) Appl. No.: 14/940,552

(22) Filed: Nov. 13, 2015

(65) Prior Publication Data
US 2017/0141562 A1    May 18, 2017

(51) Int. Cl.
| | |
|---|---|
| *H02H 3/00* | (2006.01) |
| *H02H 3/04* | (2006.01) |
| *H02M 7/00* | (2006.01) |
| *H02M 7/5387* | (2007.01) |
| *H02H 9/02* | (2006.01) |
| *H03K 17/082* | (2006.01) |
| *H02H 3/087* | (2006.01) |

(52) U.S. Cl.
CPC .............. *H02H 3/044* (2013.01); *H02M 7/00* (2013.01); *H02M 7/5387* (2013.01); *H02H 3/087* (2013.01); *H02H 9/02* (2013.01); *H03K 17/0822* (2013.01)

(58) Field of Classification Search
USPC .............................. 361/86–87, 92, 93.7–93.9
See application file for complete search history.

(56) References Cited

U.S. PATENT DOCUMENTS

| | | | |
|---|---|---|---|
| 5,025,344 A | | 6/1991 | Maly et al. |
| 5,304,935 A | * | 4/1994 | Rathke ................. G01R 31/024 |
| | | | 324/415 |
| 5,710,515 A | | 1/1998 | Teggatz et al. |
| 5,818,251 A | | 10/1998 | Intrater |

(Continued)

FOREIGN PATENT DOCUMENTS

JP           58-88672           5/1983

OTHER PUBLICATIONS

"Automotive 3-Phase Isolator MOSFET Driver;" Allegro Microsystems, LLC, A6861, Feb. 2014; 11 pages.
Office Action dated Aug. 4, 2008; for U.S. Appl. No. 11/755,295; 14 pages.
Response dated Oct. 22, 2008 to Office Action dated Aug. 4, 2008; for U.S. Appl. No. 11/755,295; 7 pages.

(Continued)

*Primary Examiner* — Danny Nguyen
(74) *Attorney, Agent, or Firm* — Daly, Crowley, Mofford & Durkee, LLP

(57) ABSTRACT

A method for signaling between a controller and a driver includes receiving, at a pin of the driver coupled to the controller, a command signal generated by the controller and generating, by the driver at the pin coupled to the controller, a fault signal indicating a fault condition. The driver can be configured to drive a switch and the command signal can be configured to cause the driver to open the switch when the command signal is in a first state and to close the switch when the command signal is in a second state. The command signal being in the first state may correspond to the command signal having a voltage level above a first predetermined threshold and the command signal being in the second state may correspond to the command signal having a voltage level below a second predetermined threshold.

8 Claims, 11 Drawing Sheets

(56) References Cited

U.S. PATENT DOCUMENTS

| | | | | |
|---|---|---|---|---|
| 5,969,919 | A * | 10/1999 | Kobayashi | B62D 5/0457 |
| | | | | 318/281 |
| 6,693,782 | B1 | 2/2004 | Lash | |
| 7,552,016 | B2 | 6/2009 | Vig et al. | |
| 7,573,393 | B2 | 8/2009 | Haas et al. | |
| 9,124,092 | B2 * | 9/2015 | Jang | H02P 27/08 |
| 2006/0259256 | A1 | 11/2006 | Roach | |
| 2011/0193580 | A1 * | 8/2011 | League | G01R 31/40 |
| | | | | 324/750.3 |
| 2014/0184200 | A1 | 7/2014 | Milano et al. | |
| 2016/0087422 | A1 * | 3/2016 | Mourrier | H02H 7/0844 |
| | | | | 361/86 |

OTHER PUBLICATIONS

Office Action dated Dec. 24, 2008; for U.S. Appl. No. 11/755,295; 11 pages.
Response filed Jan. 28, 2009 to Office Action dated Dec. 24, 2008; for U.S. Appl. No. 11/755,295; 8 pages.
Notice of Allowance dated Mar. 11, 2009; for U.S. Appl. No. 11/755,295; 7 pages.
PCT International Search Report and Written Opinion of the ISA dated Sep. 4, 2008; For PCT Pat. App. No. PCT/US2008/063400; 9 pages.
"12 V High-Side Hot-Swap Hall Effect Based Current Monitor;" Allegro Microsystems ACS760ELF20B-DS, Revision 3; Jan. 1, 2007; 15 pages.

* cited by examiner

US 9,935,452 B2

CIRCUITS AND TECHNIQUES FOR SIGNALING BETWEEN DEVICES

FIELD

This invention relates generally to circuits and techniques for signaling between devices.

BACKGROUND

Communication between electronic devices, such as integrated circuits, requires electrical contacts on both devices to be coupled together, which contacts may take the form of pins of an integrated circuit. Often, each signal coupled from one device to another is associated with a separate, dedicated pin. For example, in a motor control system, a driver may be coupled to a controller through one pin at which a command signal from the controller is provided to the driver. It is desirable to minimize the package size of integrated circuits and thus, the number of pins required.

SUMMARY

The present application is directed to systems and methods of signaling for a switch, such as an isolation switch, that connects a bridge network to a motor. To ensure that safety is enhanced by the introduction of the isolation switch, signals can be communicated to the isolation switch as well as between a controller and driver coupled to the isolator switch. The controller can communicate control signals to the driver that is configured to drive the switch. The driver can operate the switch responsive to the command signal, for example, the driver can open or close the switch.

According to one aspect of the present disclosure, a method for signaling between a controller and a driver includes receiving, at a pin of the driver coupled to the controller, a command signal generated by the controller. The driver, at the pin coupled to the controller, can generate a fault signal indicating a fault condition substantially simultaneously with receiving the command signal. The driver can be configured for driving a switch and the command signal can cause the driver to open the switch when the command signal is in a first state and to close the switch when the command signal is in a second state. The driver may generate a fault signal indicating a fault condition of the switch. The command signal being in the first state can correspond to the command signal having a voltage level above a first predetermined threshold and the command signal being in the second state can correspond to the command signal having a voltage level below a second predetermined threshold and wherein the fault signal can have a voltage level above the first predetermined threshold or below the second predetermined threshold.

According to another aspect of the present disclosure, a method for signaling between a controller and a driver for driving a switch includes receiving, at a pin of the driver coupled to the controller, a command signal generated by the controller and configured to cause the driver to open the switch when the command signal is in a first state and to close the switch when the command signal is in a second state. The method further includes generating, by the driver at the pin coupled to the controller, a fault signal indicating a fault condition of the switch. The fault signal can be generated substantially simultaneously with receiving the command signal. In some embodiments, the command signal being in the first state corresponds to the command signal having a voltage level above a first predetermined threshold and the command signal being in the second state corresponds to the command signal having a voltage level below a second predetermined threshold and the fault signal has a voltage level above the first predetermined threshold or below the second predetermined threshold.

According to another aspect of the present disclosure, a driver for driving a field effect transistor includes a gate drive circuit coupled to a gate terminal of the field effect transistor to control conduction of the field effect transistor in response to a command signal received at a pin of the driver. The driver further includes a monitor circuit configured to monitor a voltage associated with the field effect transistor and to generate a fault signal at the pin if the voltage meets a predetermined condition. The monitor circuit can be configured to monitor the voltage between the gate terminal and a source terminal of the field effect transistor and the predetermined condition may be an undervoltage condition.

In some embodiments, the command signal can be generated by a controller coupled to the pin of the driver. The command signal can be in a first state corresponding to a voltage level greater than a first predetermined level to cause the field effect transistor to conduct or in a second state corresponding to a voltage level less than a second predetermined level to cause the field effect transistor to cease conduction and the fault signal can have a voltage level greater the first predetermined threshold or less than the second predetermined threshold.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

The present disclosure is directed to systems and methods for controlling and monitoring operation of one or more isolation switches, as may be configured for coupling between a bridge network and a load, such as a motor in a motor control system. The isolation switch(es) permit power to the motor to be disconnected in order to avoid dangerous motor operation in the event of failure of the system or a system component. The isolation switch(es) can be controlled by an isolator driver that includes a control circuit to control conduction of the switch(es) and a voltage monitor circuit configured to monitor a control voltage coupled to the isolation switch(es). If there is insufficient control voltage to accurately and reliably control conduction of the isolation switch(es), then a fault indication can be generated and transmitted to a system controller that is configured to control operation of the motor.

Figure 1:
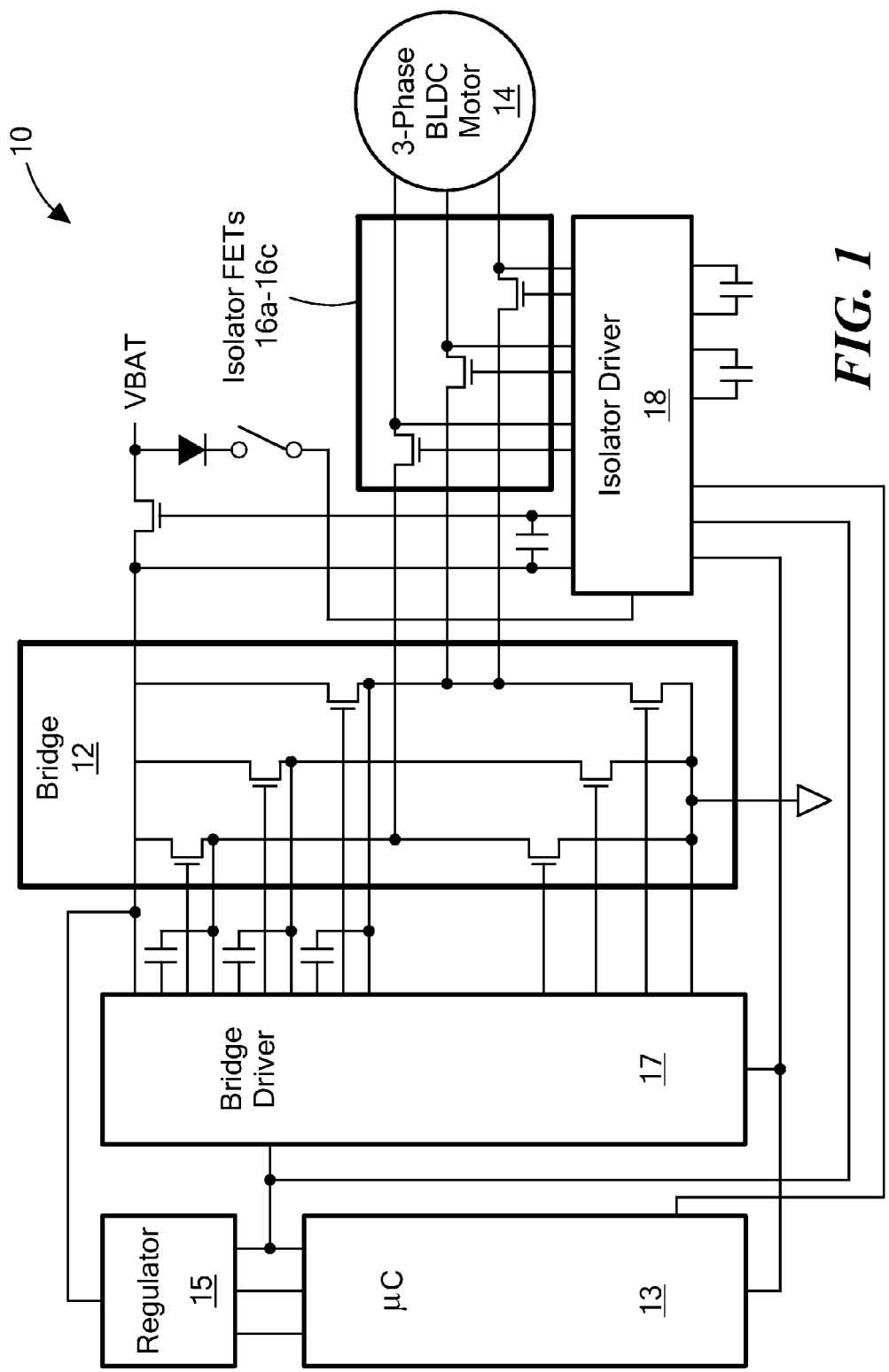
FIG. 1 is a circuit block diagram of a motor control system with isolation switches.

Now referring to FIG. 1, a motor control system 10 includes a bridge network 12 coupled to a motor 14 through one or more isolation (or simply isolator) switches 16, here switches 16a-16c. Bridge network 12 can be configured to manage and sequence power to motor 14 under the control of a bridge driver 17. The bridge driver 17 can, in turn, be controlled by a controller 13 to energize and discharge the motor windings in such a way as to start the motor, maintain the motor at a set speed, and brake the motor as commanded by the controller. Thus, the controller 13, as may take the form of microprocessor for example, provides control signals to the bridge driver 17 in order to ultimately control a desired operation of the motor 14. Power may be provided to the motor control system 10 by a regulator 15 that generates a supply voltage VBAT.

Motor, or more generally load, 14 can have various configurations, such as a single phase motor, a two-phase motor, or a three-phase motor as in the illustrated system 10. Furthermore, the motor may be of various types, such as a BLDC motor as in the illustrated system 10, a DC stepper motor, or even a non-motor power delivery, regeneration, and braking load, etc. Here, bridge network 12 is a three-phase bridge configured to control the illustrated 3-phase BLDC motor 14. It will be appreciated however, that other bridge network configurations can be used and can control other configurations and types of loads. As one of many examples, a bridge network may be provided in the form of an H-bridge to control a single phase motor.

Generally, each phase of motor 14 is associated with an independent, or dedicated isolation switch 16. Accordingly, in the illustrated 3-phase embodiment, three isolation switches 16a-16c are provided, each associated with a respective winding of the three-phase motor 14.

Isolation switches 16a-16c may take various forms of switches suitable to connect and disconnect power to and from the motor 14. Examples include a solid-state relay or an electromechanical relay. The illustrated isolation switches 16a-16c are provided in the form of solid-state Field Effect Transistors (FETs) and more particularly in the form of NMOS FETs. For example, in one embodiment, isolation switches 16a-c can be coupled to motor 14 with a source terminal of each of the isolation switches 16a-16c coupled to the bridge network 12 and a drain terminal coupled to a respective motor winding. Alternatively, isolation switches 16a-16c can be coupled to motor 14 with the source terminal of each isolation switch 16a-16c coupled to the respective motor winding and the drain terminal coupled to the bridge network 12.

Isolation switches 16a-16c are controlled by an isolator driver 18. Driver 18 responds to command signal(s) from the controller 13 to open and close the isolator switches 16a-16c as necessary to ensure safe motor operation. Additionally, isolator driver 18 can perform diagnostics on the operation of isolation switches 16a-16c to ensure they are operating correctly (i.e., in an ON state or OFF state). In cases when isolation switches 16a-16c are not operating properly, for example if there is insufficient gate drive to a gate terminal of an isolation switch 16, the driver 18 can be configured to provide a fault indication to the controller 13.

Figure 2:
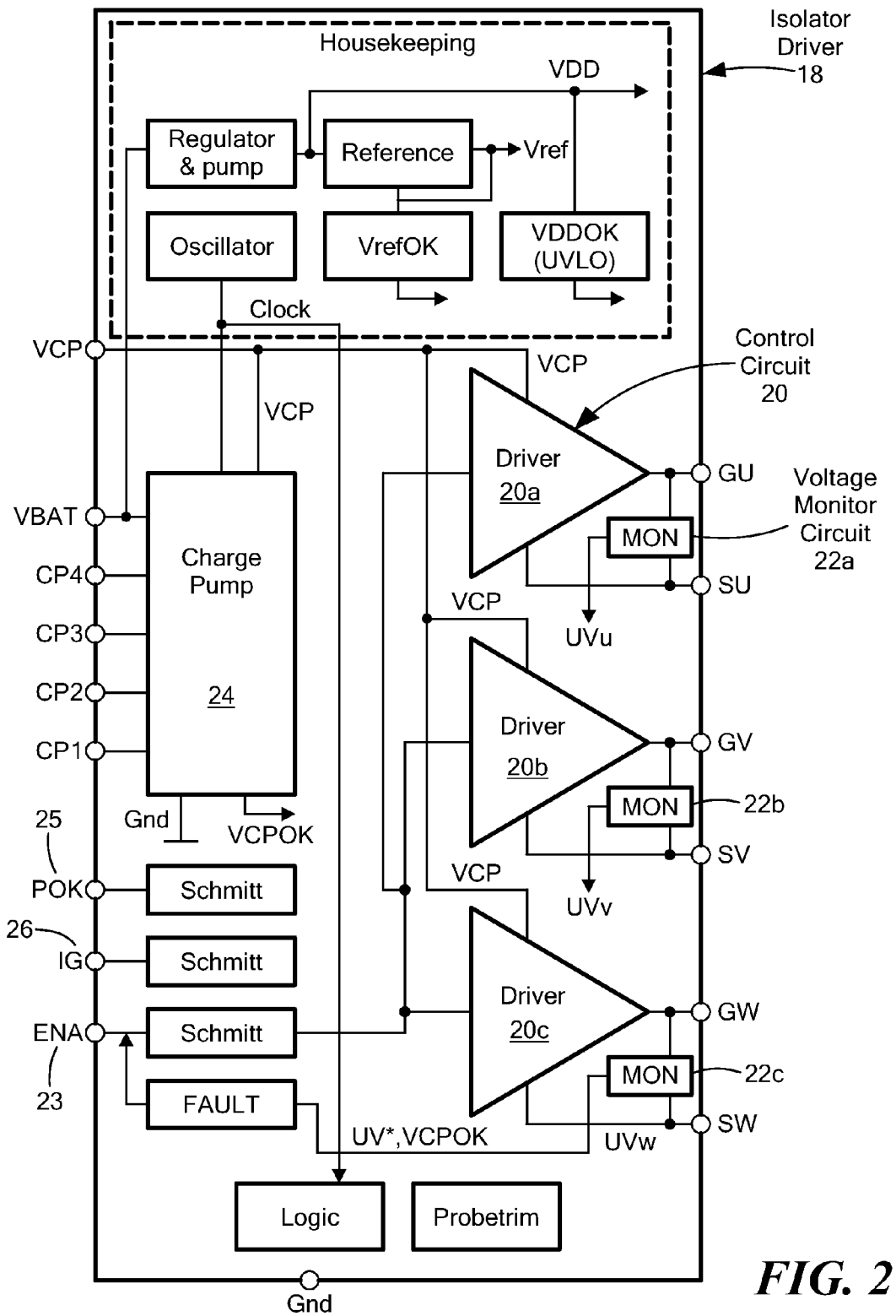
FIG. 2 is a circuit diagram block of the isolator driver of the system of FIG. 1.

Now referring also to FIG. 2, an example isolator driver 18 includes a control circuit 20 to control conduction of the isolation switch(es) and a voltage monitor circuit 22 to monitor a control voltage coupled to the isolation switches and to generate a fault indication if the control voltage is less than a predetermined threshold. In the illustrated three-phase motor embodiment, the control circuit 20 may include three respective control circuit portions 20a-20c, as shown, each configured to couple to the gate and source terminals of a respective isolator switch 16a-16c. For example, control circuit 20a may be coupled to the gate terminal of isolator switch 16a at pin GU and to the source terminal of switch 16a at pin SU.

In some embodiments, voltage monitor circuit 22 is an undervoltage monitor configured to check that the respective gate drive output voltage is high enough to ensure that the driven isolation switch can be maintained in a safe conducting state. If the gate drive output voltage is less than an undervoltage threshold, a fault indication can be communicated to the controller 13 (FIG. 1). In some embodiments, driver 18 includes a plurality of voltage monitor circuits 22a-22c such that each of the isolation switches 16a-16c is coupled to a respective voltage monitor circuit.

Because the isolation switches 16a-16c are coupled between the bridge network 12 and motor 14, their source terminals are "floating" (not referred to a fixed reference potential) and accordingly, the control voltage provided by the isolator driver 18 to the switches 16a-16c is a floating voltage. In particular, the source terminals of the switches 16a-16c can range in voltage from below ground to above the supply voltage VBAT. As a result, the isolator driver 18, and in particular the control circuit 20 and the voltage monitor circuit, requires a supply voltage that can range from below ground to greater than the supply voltage VBAT. To this end, the isolator driver 18 may include a charge pump 24.

In an embodiment, the system controller 13 (FIG. 1) controls the isolator driver 18 through an input 23 (e.g., ENA pin). For example, when input pin 23 is high, driver 18 drive the isolation switches to an ON state. Alternatively, when input pin 23 is low, driver 18 may drive the isolation switches to an OFF state. As will be explained, in some embodiments, the input 23 can additionally be used by the driver 18 to communicate with the controller 13 (e.g., can be used to communicate a fault signal and/or the status of the charge pump 24).

Control circuit 20 provides a gate drive, or control signal to the gate terminal of the isolation switches. In one embodiment, each control circuit portion 20a-20c includes an N-channel power MOSFET driver coupled to the gate terminal of the respective isolator switch and capable of turning on the isolation switch (e.g., ON state) and maintaining the ON state during transients on the terminals of the isolation switch. The control circuit portions 20a-20c can also turn off the respective isolation switch (e.g., OFF state) and hold the isolation switch in the OFF state during transients on the terminals of the isolation switch.

Charge pump 24 provides a charge pump voltage VCP greater than the supply voltage VBAT to the control circuit 20 that can be used to turn on or maintain the isolation switches 16a-16c in the ON state continuously when the phase voltage is equal to the battery voltage VBAT. With the charge pump 24, the isolator driver 18 can operate over a range of supply voltages VBAT, such as between 4.5V to about 50V, through which the driver 18 can maintain an isolation switch in an OFF state down to approximately 4.0V. Driver 18 may operate without any unsafe states down to a supply voltage VBAT of 0V to ensure safe operation during power-up and power-down events. As the supply voltage rises from 0V, driver 18 can maintain the isolation switches in the OFF state until a gate voltage to the gate terminal of the isolation switches is sufficiently high to ensure conduction and the outputs are enabled for the isolation switch.

In one embodiment, the charge pump voltage VCP generated by the charge pump 24 can be limited to some predetermined amount greater than the supply voltage VBAT, such as 12V greater than the VBAT voltage. The charge pump voltage VCP is selected to enable sufficient gate drive voltage (e.g., gate drive voltages of at least 7.5V) to be provided to the isolation switches 16a-16c for battery voltages as low as a predetermined level, such as for battery voltages down to 4.5V.

The charge pump voltage VCP may be used to power the control circuit 20 and the monitor circuit 22. In one embodiment, the charge pump 24 is used to generate an auxiliary supply voltage VAUX that is provided to the voltage monitor circuit 22, as will be explained.

The isolator driver 18 may include various additional features. For example, the charge pump 24 can be enabled and/or disabled through a power OK (POK) input 25 and/or an ignition (IG) input 26. The charge pump voltage VCP may be monitored to generate a charge pump undervoltage indication. The illustrative isolator driver 18 can be provided in the form of an integrated circuit or other suitable form for a particular application.

Figure 3:
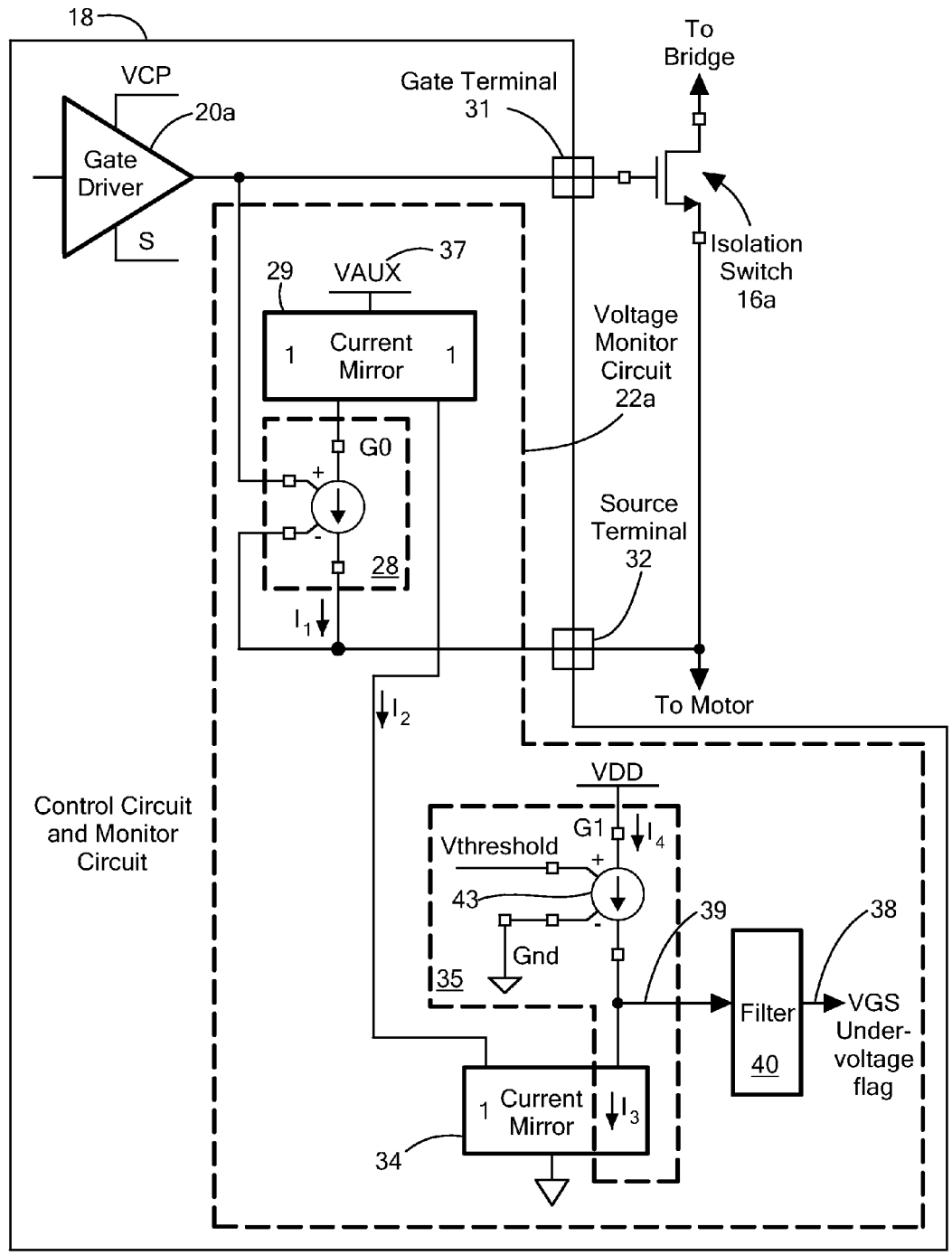
FIG. 3 is a circuit diagram of a portion of the isolator driver of FIG. 2 including a gate driver and monitor circuit for VGS monitoring.

Now referring to FIG. 3, a portion of the isolator driver 18 (FIG. 2) is shown, including control circuit portion 20a (or simply control circuit 20a) and voltage monitor circuit portion 22a (or simply monitor circuit 22a) for controlling and monitoring a respective isolation switch 16a. Isolation switch 16a is here, provided in the form of a NMOS device having a drain terminal coupled to the bridge network 12 (FIG. 1), a gate terminal 31 coupled to the control circuit 20a, and a source terminal 32 coupled to the motor 14 (FIG. 1). Monitor circuit 22a monitors the control voltage provided to the gate terminal 31 of the isolation switch 16a by monitoring the gate to source (VGS) voltage of the isolation switch 16a.

Monitor circuit 22a can monitor the differential voltage between the gate terminal 31 and the source terminal 32 of the isolation switch 16a (i.e., the switch control voltage) to determine if the control voltage is sufficiently high to keep the isolation switch 16 in the ON state when it is commanded to be in the ON state. To this end, the monitor circuit "follows" the voltage at the source terminal 32 to determine if the corresponding gate terminal 31 is sufficiently higher than the source terminal. If an under-voltage condition is detected, driver 18 can generate a fault indication (e.g., signal or flag) 38 to indicate the VGS value is under-voltage or below a predetermined voltage threshold. In some embodiments, driver 18 can transmit or communicate the fault indication 38 to a microcontroller (e.g., controller 13 of FIG. 1).

As mentioned, because the isolation switch 16a is floating, it is necessary to drive the gate terminal 31 with a voltage higher than the supply voltage VBAT. To this end, in some embodiments, an auxiliary supply voltage, VAUX, 37 can supply power to monitor circuit 22. In one embodiment, the VAUX voltage 37 is generated from either the supply voltage, VBAT, or the charge pump voltage, VCP, depending on certain conditions. For example, if the supply voltage VBAT is greater that the voltage on the source terminal 31 by at least a predetermined voltage, then the supply voltage VBAT may be used to provide the VAUX voltage 37. Alternatively, if the supply voltage VBAT is not greater that the voltage on the source terminal 31 by at least the predetermined voltage, then the charge pump voltage VCP may provide the VAUX voltage 37.

As one example, the predetermined voltage may be on the order of between 6-10V. With this arrangement, the VAUX voltage 37 is established at a level sufficient to supply only the voltage necessary to reliably drive the isolation switch. In some embodiments, the VAUX voltage 37 is a voltage that is floating a number of volts above a voltage at source terminal 37, whereby the number of voltage above is selected in order to provide sufficient voltage for the monitor circuit 22a to operate. In one embodiment, the VAUX voltage 37 is provided from gate terminal 31. For example, the VAUX voltage 27 may be coupled to gate terminal 31 to provide a voltage to current mirror 29. It should be appreciated that the VAUX voltage 37 may be generated in a numbers of ways depending on a particular application.

The monitor circuit 22a includes a resistive element 28 coupled between the gate terminal 31 and source terminal 32 of the isolation switch 16a to generate a current I1 proportional to the gate to source voltage VGS. Here, the resistive element 28 is provided in the form of a voltage-controlled current source 28, such as a MOSFET device. In some embodiments, resistive element 28 is a combination of a resistor and a diode connected reference device acting as a current reference element in current mirror 29. Resistive element 28 has a gain G0 and provides a resistance based on the gate to source voltage VGS.

A current mirror 29 is provided to shift the level of the VGS proportional current $I_1$ to a reference potential. Resistive element 28 is coupled in series with a first leg of the current mirror 29. The second leg of the current mirror 29 is coupled to a reference potential, here ground, through a further current mirror 34. Thus, the level-shifted current $I_2$ is provided in a first leg of current mirror 34.

A second leg of the current mirror 34 forms part of a current comparator 35 that functions to compare a mirrored version $I_3$ of the level-shifted current $I_2$ to a threshold current $I_4$. Threshold current $I_4$ can be generated in various ways, such as with a voltage-controlled element 43 coupled to a supply voltage, $V_{DD}$, and controlled by a threshold voltage, Vthreshold, and having a gain $G_1$, as shown. Thus, the current comparator 35 includes a first current path configured to carry the threshold current $I_4$ and a second current path configured to carry the level-shifted current $I_3$. Current comparator 35 may further include a voltage node 39 between the first and second current paths at which is provided a voltage indicative of a level of the level-shifted current $I_3$ relative to a level of the threshold current $I_4$ and thus, indicative of the gate to source voltage VGS being below a predetermined level established by the threshold current $I_4$.

In some embodiments, the voltage generated at the voltage node 39 may be filtered by a filter 40 that provides a fault indication 38 indicative of an undervoltage of the VGS voltage. In one embodiment, the filter 40 may take the form of a debounce filter to ensure that a fault indication is valid (i.e., is not a transient or false indication) before communicating the fault signal 38 to the controller. Filter 40 can be implemented using analog circuits and/or methods, digital circuits and/or methods, or a combination thereof.

A resistance, sometimes referred to as a passive pull off resistor, is coupled between the gate and source terminals 31, 32 of isolation switch 16*a* in order to prevent the isolation switch 16*a* from turning on unintentionally. In the illustrative embodiment, advantageously, the resistive element 28 may perform the functionality of the passive pull off resistor (in addition to generating the current $I_1$ that is proportional to the VGS voltage).

Figure 3A:
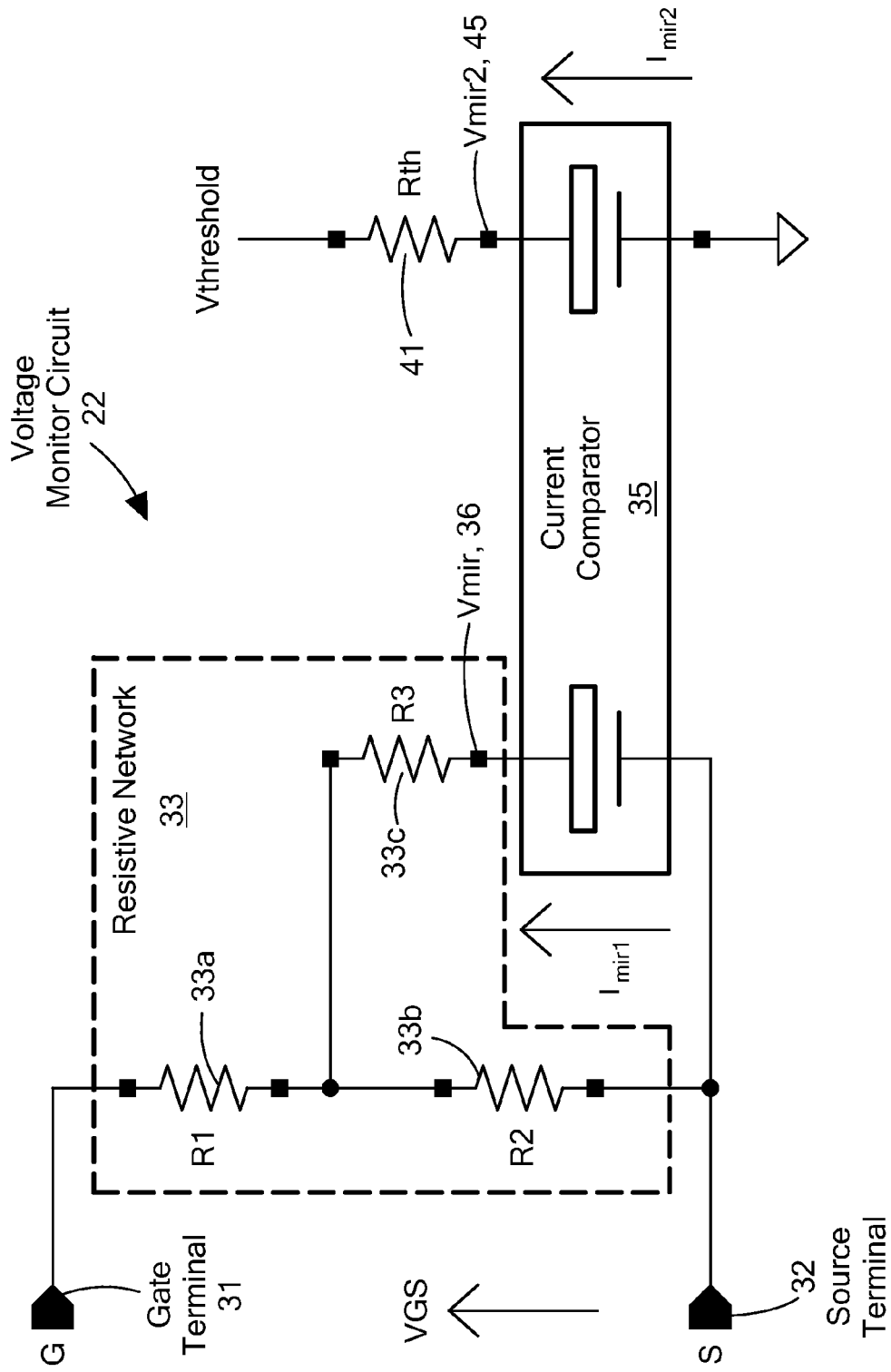
FIG. 3A is an equivalent circuit diagram of the VGS monitor circuit of FIG. 3.

Now referring to FIG. 3A, an equivalent circuit representation of the voltage monitor circuit 22*a* of FIG. 3 is shown to illustrate a methodology for selecting the threshold current I4 (FIG. 3). A voltage Vmir 36 at a first input of current comparator 35 can be considered established by a resistive network 33 including a resistor divider made up of resistors $R_1$ 33*a* and $R_2$ 33*b* coupled between the switch gate and source terminals 31, 32 and a further resistor $R_3$ 33*c*, coupled to a node between resistors 33*a* and 33*b* and the first leg of the current comparator 35, as shown. A second input of current comparator 35 is at a voltage Vmir2 45 and can be considered established by a threshold resistor 41 coupled to the threshold voltage Vthreshold. The voltages Vmir and Vmir2 can be considered to correspond to the voltage-controlled current sources 28, 43 of FIG. 3, the current $I_{mir}$ corresponds to the current $I_3$ of FIG. 3, and the current through threshold resistor 41 corresponds to the threshold current $I_4$ of FIG. 3.

The Thevenin equivalent voltage across the gate and source terminals 31, 32 can be expressed as:

$$V_{thev}=((VGS)(R_2))/(R_1+R_2) \quad (1)$$

And the Thevenin impedance as:

$$R_{thev}=((R_1)(R_2))/(R_1+R_2) \quad (2)$$

By superposition, the current $I_{mir}$ through the left side of the current comparator 35 (corresponding to the current $I_3$ in FIG. 3) can be expressed as:

$$I_{mir}=(V_{thev}-V\text{mir})/(R_3+R_{thev}) \quad (3)$$

And the current $I_{mir2}$ through the right side of the current comparator 35 (corresponding to the current $I_4$ in FIG. 3) can be expressed as:

$$I_{mir2}=(V\text{threshold}-V\text{mir2})/R_{th} \quad (4)$$

The trip point of the current comparator 35 occurs when the current $I_{mir}$ is equal to the current $I_{mir2}$. The threshold resistor 41 can be expressed as the resistance of resistor 33*c* plus the Thevenin resistance of equation (2) and the threshold voltage Vthreshold is equal to the Thevenin voltage of equation (1). Accordingly, the threshold voltage Vthreshold and the threshold resistance $R_{th}$ can be selected to trip the current comparator 35 at a desired undervoltage threshold of the VGS voltage according to the above relationships. For example, with a VGS set to 6V for example, the values of resistors 33*a*, 33*b*, and 33*c* can be chosen for a set current Imir.

In embodiments in which the voltage-controlled current source 28 acts as the passive pull off resistor between the gate and source terminals 31, 32 of the isolation switch 16*a*, the value of the current Imir is selected so that the total current sourced from gate terminal 31 at full drive (i.e., not at a trip point) is the same as what a simple resistor passive pull-down would normally sink. With this arrangement, the current drawn by the monitor circuit 22*a* is relatively small, thereby avoiding overloading the VAUX voltage and/or the charge pump voltage VCP that powers the monitor circuit.

Figure 4:
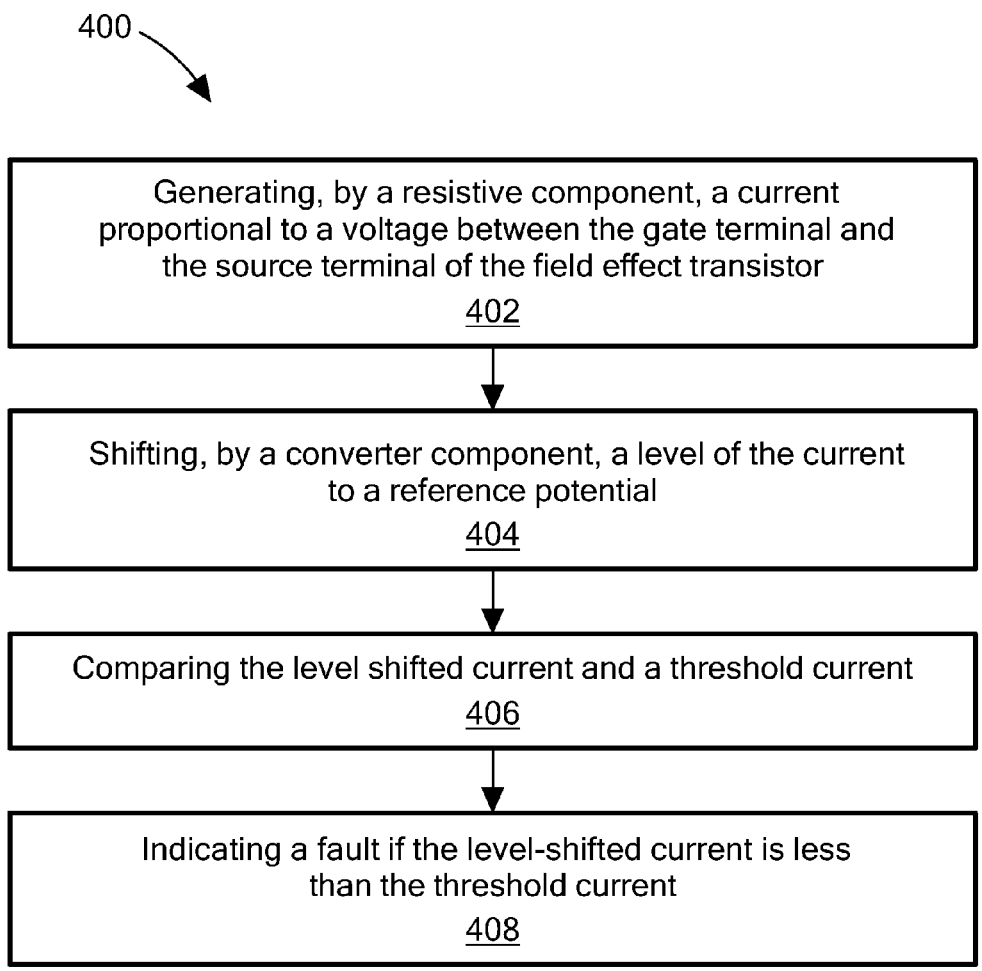
FIG. 4 is a flow diagram of a method for VGS monitoring.

Now referring to FIG. 4, a flow diagram of a method for monitoring a control voltage provided to an isolation switch (e.g., a voltage between a gate terminal and a source terminal of an isolation switch) is provided. In some embodiments, the isolation switch is coupled between a motor winding and a motor driver and is configured to isolate the motor winding from the motor driver as shown in FIG. 1.

At step 402, a resistive component is used to generate a current that is proportional to a voltage between the gate terminal and the source terminal of the isolation switch. In some embodiments, the resistive component includes a FET, such as the element 28 of FIG. 3. In some embodiments, a resistor provided between the gate terminal and the source terminal of the isolation switch to prevent the isolation switch from turning on unintentionally can additionally be used as the resistive component to generate the proportional current.

At step 404, a converter component shifts a level of the VGS proportional current to a reference potential. In some embodiments, a current mirror, such as current mirror 29 of FIG. 3 is used to level-shift the VGS proportional current.

At step 406, the level-shifted current is compared to a threshold current. In some embodiments, a comparator or current comparator is provided to compare the level-shifted current to the threshold current, such as may take the form of current comparator 35 (FIG. 3).

At step 408, an indication of a fault is generated if the level-shifted current is less than the threshold current. A comparator can generate the fault indication (e.g., flag) if there is insufficient control voltage to the gate terminal of the isolation switch. For example, there may be insufficient voltage to keep or maintain the isolation switch in the ON state when the isolation switch is commanded to be on. In some embodiments, the fault indication identifies an undervoltage condition between the gate terminal and the source terminal of the isolation switch in response to the level-shifted current being less than a threshold current.

The fault indication can be transmitted to various components of a motor control system configured to control operation of the isolation switch. In some embodiments, the fault indication is transmitted to a controller that is configured to control conduction of the isolation switch, such as controller 13 of FIG. 1. In response to receiving the fault indication, the controller can generate and transmit one or more command signals to components of the motor control system. For example, the controller can generate and transmit a command signal to cause the driver to put the isolation switch in the OFF state. In one embodiment, a fault signal (e.g., signal 38 in FIG. 3) may be provided at a first logic level to indicate a VGS undervoltage condition if the level-shifted current $I_3$ is less than the threshold current $I_4$ and may be provided at a second logic level to indicate that the VGS voltage is sufficient to drive the isolation switch if the level-shifted current $I_3$ is greater than the threshold current $I_4$.

Figure 5:
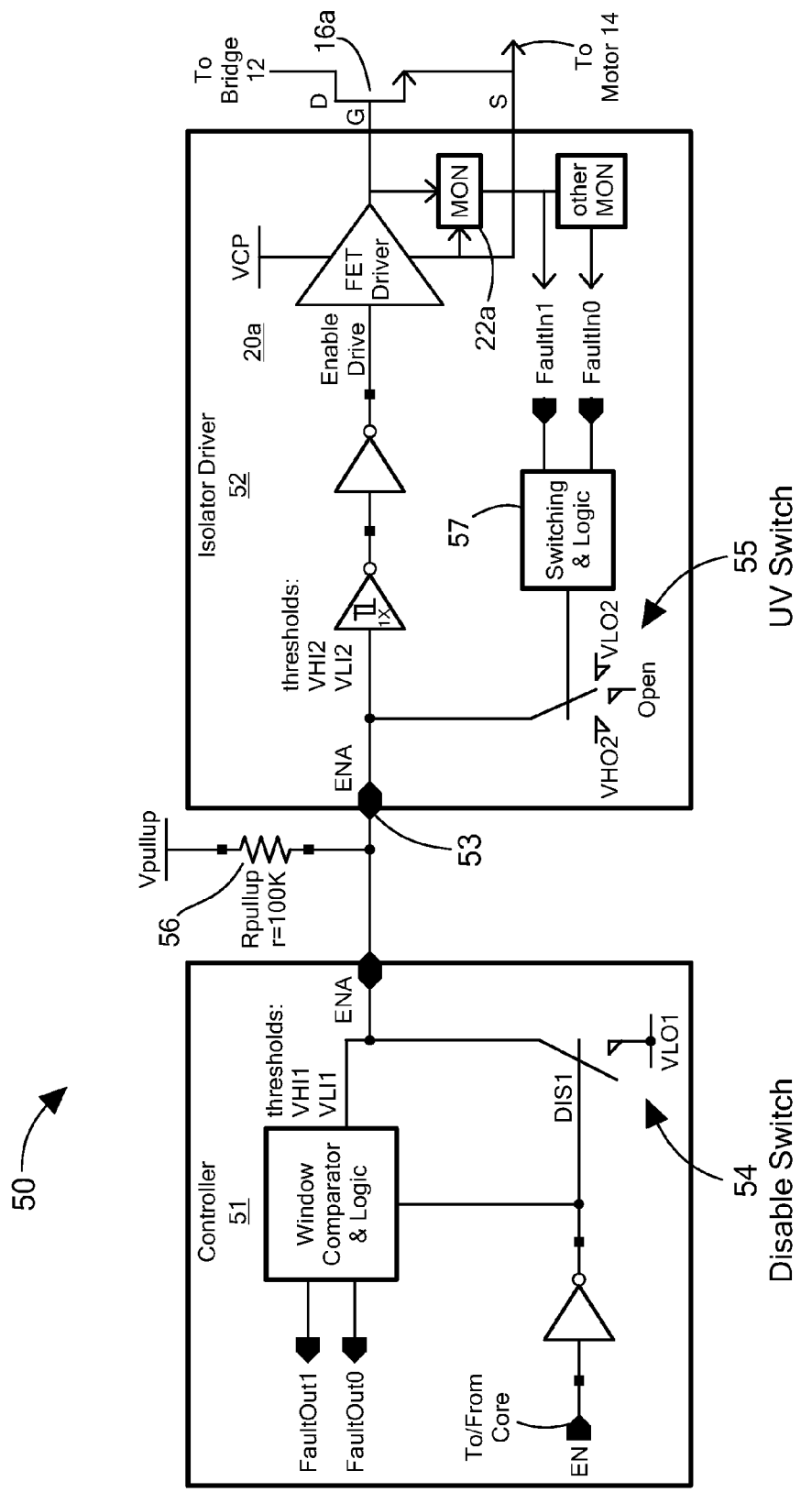
FIG. 5 is a circuit diagram of a system implementing a quad-level signaling scheme.
Figure 5A:
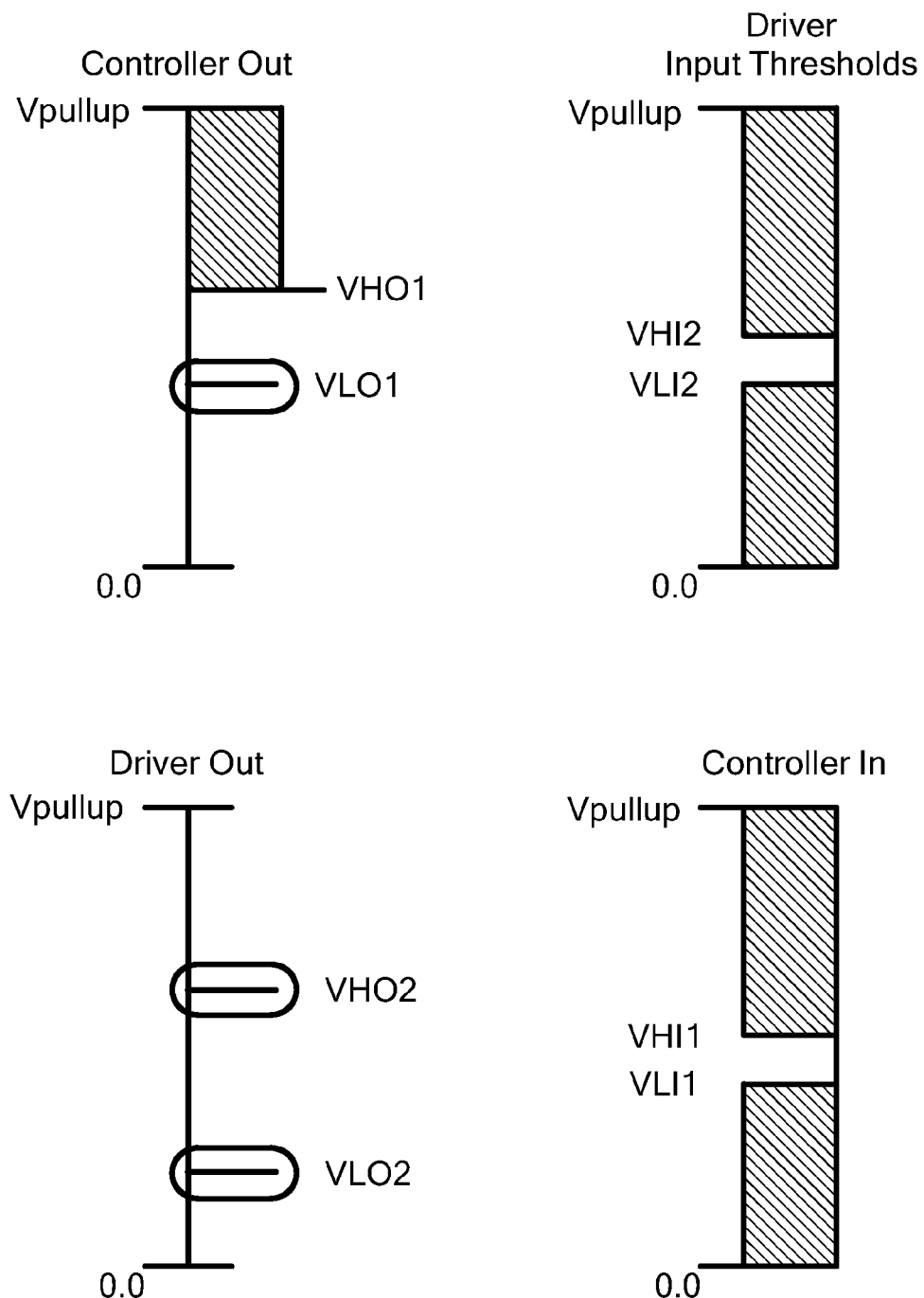
FIG. 5A is a diagram of threshold levels for the quad-level signaling scheme of FIG. 5.

Now referring to FIGS. 5-5A, a system 50 and illustrative threshold and signal levels for signaling between devices, such as a controller 51 and a driver 52, are shown. The driver 52 may be an isolator driver that is the same as or similar to driver 18 of FIG. 1 and the controller 51 may be the same as or similar to the controller 13 of FIG. 1. In the illustrated example, the isolator driver 52 includes control circuit 20*a* and voltage monitor circuit 22*a* to control and monitor a respective isolation switch 16*a* (FIG. 3).

Controller 51 can be configured to provide one or more command signals to cause the driver 52 to change a state of one or more isolation switches coupled to the driver 52. For example, the controller 51 may be coupled to a pin 53 (e.g., ENA pin) of the isolator driver 52 through which the command signal is provided to control conduction of isolation switch 16a. In some embodiments, pin 53 is a logic level input through which one or more gate drive outputs of the driver are controlled by the command signal from the controller.

Signaling between the controller 51 and a driver 52 can include receiving, at the pin 53, a command signal generated by the controller. The driver, at the pin 53 coupled to the controller, can generate a fault signal indicating a fault condition substantially simultaneously with receiving the command signal. The fault signal may indicate a fault condition associated with the isolation switch 16a.

In some embodiments, controller 51 can cause the driver 52 to close the switch 16a when the command signal is in a first state (e.g., a logic high state) and to open the switch 16a when the command signal is in a second state (e.g., a logic low state). The command signal being in the first state to close the switch can correspond to the command signal having a voltage level above a first predetermined threshold (e.g., VHI2) and the command signal being in the second state to open the switch can correspond to the command signal having a voltage level below a second predetermined threshold level (e.g., VLI2).

The controller 51 may include a disable switch 54 (i.e., DIS) through which the command signal is generated in response to a signal from a core of the controller for example. Controller 51 can open disable switch 54 which causes the pin 53 to be pulled up through a pullup resistor 56 to a Vpullup voltage that is greater than the first predetermined threshold VHI2, thereby commanding the isolator driver 52 to put the switch 16a in the ON state. Alternatively, controller 51 can close the disable switch 54 which causes the pin 53 to be coupled to a predetermined threshold level VL01, that is less than the second predetermined threshold voltage VLI2, thereby causing the isolator driver 52 to put the switch 16a in the OFF state.

More generally, as shown in the "Controller Out" portion of FIG. 5A, a first range of command signal levels (here voltages from VH01 to Vpullup) can cause the driver 52 to close the isolation switch 16a and a second range of command signal levels (here, a voltage of VL01 or lower) can cause the driver 52 to open the isolation switch. Driver 52 includes control circuit 20a, as may include an inverter with hysteresis, a buffer, and a FET driver, to generate a control signal for the isolation switch 16a. As shown in the "Driver Input Thresholds" portion of FIG. 5A, driver control circuit 20a can respond to command signal levels above the first predetermined threshold VHI2 to turn on or close the switch 16a and to command signal levels below the second predetermined threshold VLI2 to turn off or open the switch 16a.

In some embodiments, isolator driver 52 includes an undervoltage switch 55 with which the driver 52 can communicate a fault signal to the controller 51 through pin 53 and more specifically, can communicate more than one fault condition. For example, in the illustrated embodiment, the driver 52 can open the undervoltage switch 55, thereby decoupling the pin 53 from the fault switching and logic circuit 57, can couple the pin 53 to a first fault output voltage VL02 to indicate a first fault condition based on the output of the fault switching and logic circuit 57, or can couple the pin 53 to a second fault output voltage VH02 to indicate a second fault condition based on the output of the fault switching and logic circuit 57. Thus, as shown in the "Driver Out" portion of FIG. 5A, the driver 52 can couple the pin 53 to the first fault output voltage VL02 or to the second fault output voltage VH02. As shown in the "Controller In" portion of FIG. 5A, the controller 51 can respond to signal levels above a threshold VHI1 to interpret a first fault condition and can respond to signal levels below a threshold VLI1 to interpret a second fault condition. Thus, by signaling in this manner, at least two different voltage ranges may be used to indicate two different fault conditions.

The voltage levels in FIG. 5A have the following relationship, VHO1>VHI1>VHO2>VHI2 and VLI2>VLO1>VLI1>VLO2. Thus, a voltage in the range from a low input level of controller 51 (i.e., VLI1) to the low input level of isolator driver 52 (i.e., VLI2) can result in a first state of normal operation (e.g., a logic low state) and a voltage in the range from a high output level of isolator driver 52 (i.e., VH01) to a voltage pullup level (i.e., Vpullup) can result in a second state of normal operation (e.g., a logic high state). The threshold voltage levels may be set based on a particular application and the properties of the components used in the respective circuits.

The first fault output voltage level VL02 to which the driver pulls the pin 53 to indicate the first fault condition is selected in order to prevent the isolation switch 16a from being disabled. In other words, if the voltage level VL02 were too low, then the control circuit 20a would have insufficient gate drive voltage to keep the gate terminal active.

It will be appreciated that the above-described signaling scheme advantageously eliminates the need for a separate dedicated connection between the controller and driver, thereby reducing the number of pins required for the devices 51, 52. Furthermore, the bi-directional signaling scheme can occur simultaneously. In other words, the driver 52 is controlled by the controller at the same time that the driver communicates a fault condition to the controller. Additional benefit is achieved because of the "quad-level signaling" described, in which two different commands can be transmitted by the controller and interpreted by the driver (i.e., to turn on or off the isolation switch 16a) and two different fault signals can be transmitted by the driver and interpreted by the controller (i.e., the first and second fault conditions). It will also be appreciated that the signaling schemes described herein, while described in connection with signaling between a motor control system controller and isolation switch driver, can be applied with similar advantages to signaling between any two devices in any type of system.

Figure 6:
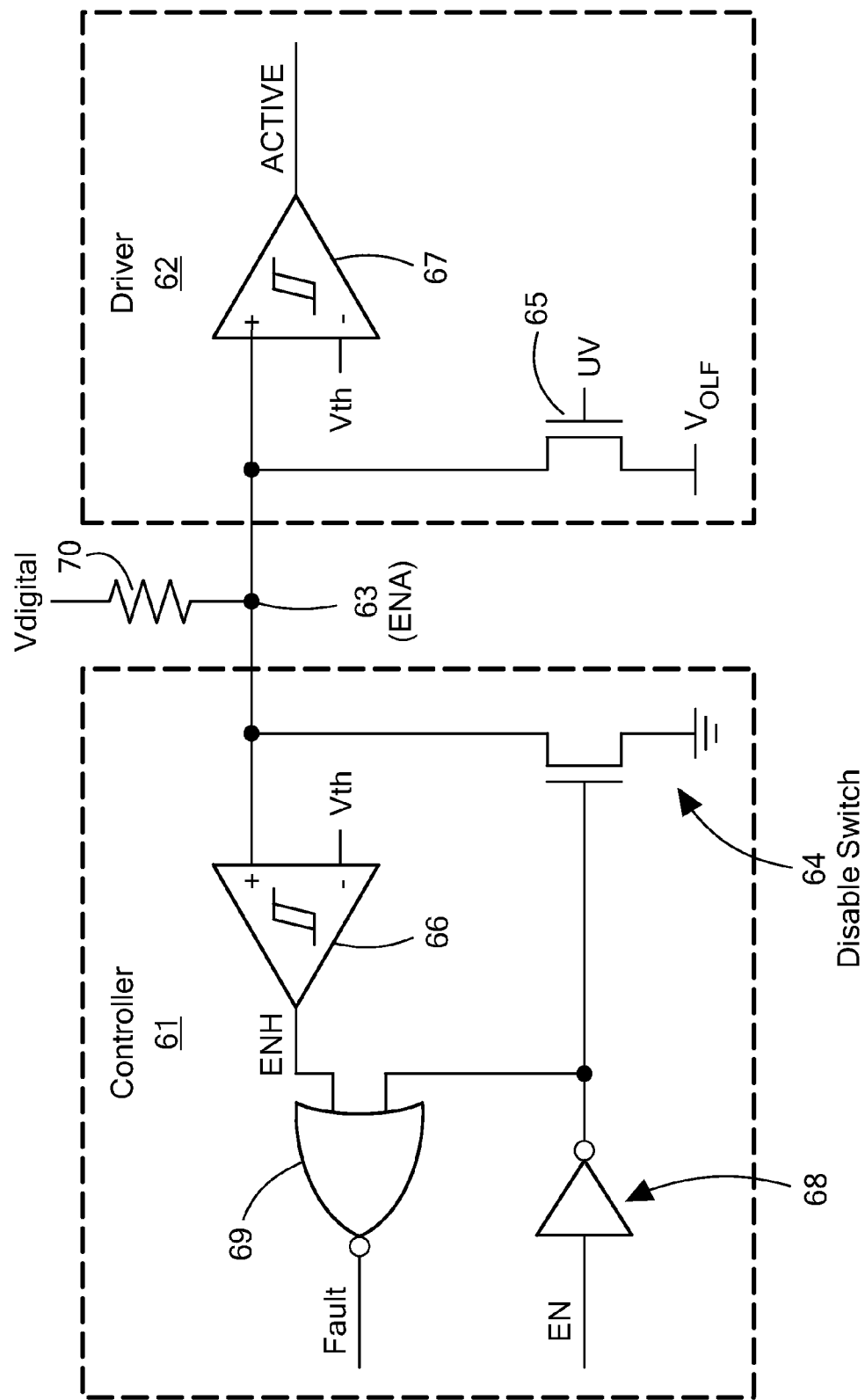
FIG. 6 is a circuit diagram of a system implementing a tri-level signaling scheme.
Figure 6A:
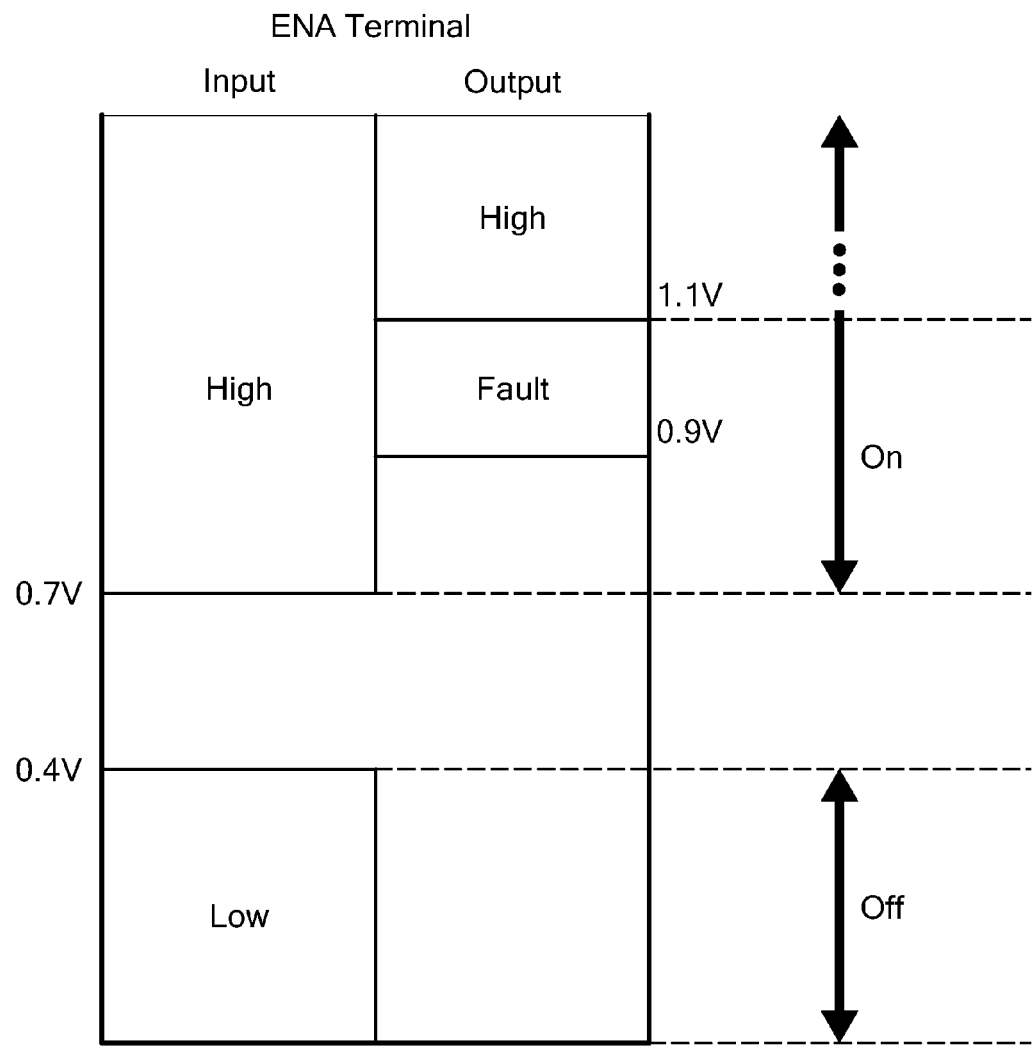
FIG. 6A is a diagram of threshold levels for the tri-level signaling scheme of FIG. 6.
Figure 6B:
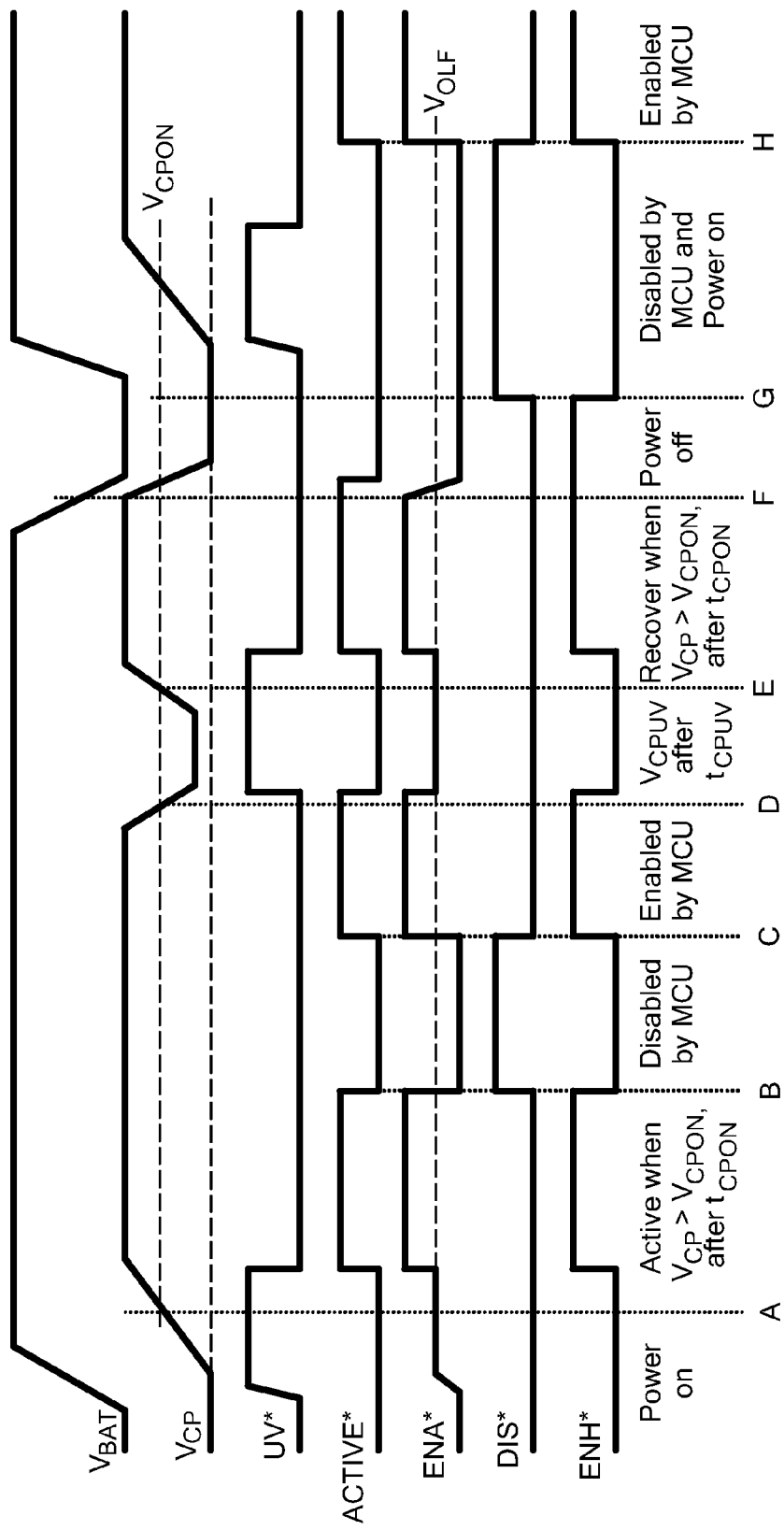
FIG. 6B is a diagram of waveforms for a tri-level signaling scheme.

Now referring to FIGS. 6-6B, a specific example controller 61 and driver 62 combination and an illustrative signaling scheme therebetween is shown. The controller 61 may be the same as or similar to controller 13 of FIG. 1 and the driver 62 may be the same as or similar to isolator driver 18 of FIG. 1. The signaling scheme illustrated in FIGS. 6-6B differs from that illustrated by FIGS. 5-5A in that FIGS. 6-6B illustrate tri-level signaling whereas FIGS. 5-5A illustrate quad-level signaling.

Signaling components of the controller and driver are shown in FIG. 6. Controller 61 can be configured to provide one or more command signals to cause driver 62 to change a state of one or more isolation switches coupled to the driver 62. For example, the controller 61 may be coupled to a pin 63 (i.e., ENA pin) of the driver 62 through which the command signal is provided. In some embodiments, pin 63 is a logic level input through which one or more gate drive outputs of the driver 62 are controlled by the command signal from the controller 61.

In some embodiments, controller 61 can cause driver 62 to close a switch, such as an isolation switch coupled to a gate driver output of driver 62, when the command signal is in a first state (e.g., logic high state) and to open a switch when the command signal is in a second state (e.g., logic low state). FIG. 6A shows (on the left side) example input signal levels to the ENA pin of the driver 62 (i.e., command signal levels generated by the controller 61). In an embodiment, the command signal being the first state to close the switch can correspond to the command signal having a voltage level above a first predetermined threshold (e.g., 0.7V in FIG. 6A) and the command signal being in the second state to open the switch can correspond to the command signal having a voltage below a second predetermined threshold level (e.g., 0.4V in FIG. 6A).

The controller 61 may include a disable switch 64 through which the command signal is generated in response to an EN signal from a core of the controller. For example, controller 61 can turn off or open disable switch 64 which causes the pin 63 to be pulled up through a pull-up resistor 70 to a Vdigital voltage that is greater than the first predetermined threshold, thereby commanding the driver 62 to put the switch in the ON state. Alternatively, controller 61 can turn on or close the disable switch 64 which causes the pin 63 to be coupled to a voltage level, such as ground, that is below the second predetermined threshold level, thereby causing the driver 62 to put the switch in the OFF state.

Driver 62 includes control circuit 20a, as may include a comparator 67 with hysteresis to generate a control, or drive signal "ACTIVE" for an isolation switch. Driver control circuit 20a can respond to command signals above the first predetermined threshold (e.g., 0.7V) to turn on or close the switch and to command signal levels below the second predetermined threshold (e.g., 0.4V) to turn off or open the switch.

Driver 62 can generate a fault signal and provide the fault signal to the controller 61 through the ENA pin 63. FIG. 6A shows (on the right side) output signal levels of the driver 62. In some embodiments, driver 62 includes an undervoltage switch 65 with which the driver 62 can communicate a fault signal to the controller 61 through pin 63. In the illustrative embodiment, driver 62 can close the undervoltage switch 65 to couple pin 63 to a fault output voltage level, $V_{OLF}$, thereby signaling a fault condition to controller 61.

The fault output voltage level $V_{OLF}$ may be selected to ensure that the driver 62 does not disable itself (i.e., does not open the isolation switch when it is being commanded to close the switch) when communicating a fault condition. For example, the minimum driver output voltage level that indicates a fault (here 0.9V) may be selected to be some predetermined voltage above the first predetermined threshold that causes the driver to close the isolation switch. The difference between the 0.9V minimum fault output voltage for a fault condition and the 0.7V minimum to turn on the isolation switch may provide a guard-band to allow correct operation in the presence of noise and IR drops. It should be recognized that the voltage levels provided above are for one embodiment and that other voltage levels may be chosen based on a particular application and properties of the components of the system.

Controller 61 can include a comparator 66 with hysteresis and a logic gate 69 (here NOR gate), to interpret the driver fault output voltage $V_{OLF}$ as indicating a fault associated with the driven isolation switch. More particularly, when an undervoltage condition is detected (i.e., when the fault flag UV is set) that causes the driver to close the undervoltage switch 65, the ENA pin 63 is coupled to the driver fault output voltage $V_{OLF}$. The threshold of comparator 66 is set to trip the comparator when the ENA pin voltage exceeds a fault threshold, here of 0.9V. The NOR gate 69 is responsive to the output of the comparator 66 and to the inverted EN signal to ensure that the controller interprets a fault indication only when the disable switch 64 is open (i.e., when the command signal is in a high logic state to cause the driver to close the isolation switch). With this arrangement, when the command signal is at a logic low level, a fault indication need not be provided to the controller (since the command signal is calling for the isolation switch to be off).

FIG. 6B illustrates the signaling scheme of the circuit of FIG. 6 based on the threshold and signal levels of FIG. 6A. In a general overview, VBAT refers to a battery voltage which can be a main power supply to the motor control system in which the configuration of FIG. 6 operates, VCP refers to a charge pump voltage of the system in which the configuration of FIG. 6 operates, UV refers to an undervoltage flag of an isolator driver, ACTIVE refers to an output of the isolator driver, ENA refers to a pin 63 that is a logic level input to the isolator driver that can be used to control the output of the isolator driver, DIS refers to a control signal of a disable switch (e.g., switch 64) of a controller configured to operate the ENA pin, and ENH refers to an output of a comparator 66 of the controller 61. The description below references elements shown in FIGS. 6 and 6A.

In the illustrative embodiment, during a power on phase indicated at point A, the supply voltage VBAT, is turned on, thereby energizing a motor control system such as motor control system 10 of FIG. 1. Initially, the undervoltage switch 65 may be closed to indicate that the gate to source voltage VGS voltage is too low to allow a switch coupled to driver 62 to operate properly and may stay closed until a supply voltage level has reached an appropriate level to operate the switch. This is further indicated by the ACTIVE signal being set low (i.e., off) in FIG. 6B. During the power on phase, the disable switch 64 is closed to pull down the ENA pin 63 in order to keep the isolation switch off.

Betweens point A and point B, the charge pump voltage Vcp steadily increases until it reaches an undervoltage threshold, Vcpon (e.g., Vcp>Vcpon). When Vcp reaches Vcpon, the undervoltage switch 65 is opened and the controller 61 provides the command signal at pin 63 (e.g., ENA) at a high level to cause the driver 62 to close the isolation switch.

Between points B and C, the controller 61 may generate a command signal to turn off a switch coupled to driver 62. To this end, the controller 61 may close disable switch 64 (DIS), thereby turning it on (i.e., set high) and in response pin 63 (ENA) is pulled down below a threshold voltage. Thus, the ACTIVE signal output of driver 62 is turned off (i.e., set low) to disable the gate terminal of the switch to which the driver 62 is coupled.

Between points C and D, the controller 61 may generate a command signal to turn on a switch coupled to driver 62. For example, controller 61 may open disable switch 64 (DIS), thereby turning it off and in response pin 63 (ENA) is pulled high above a threshold voltage. Thus, the ACTIVE signal output of driver 62 is turned on and is fed to the gate terminal of the switch to put the switch in the ON state.

Between points D and E, if a voltage at the charge pump, Vcp, drops below the undervoltage threshold, Vcpon, a timer may be started. If Vcp stays below Vcpon for the duration of an undervoltage filter time, Tcpuv, an undervoltage condition can be asserted (UV flag can be set). In response to the UV flag, controller 61 may generate command signals to turn off a switch coupled to driver 62. In such an embodiment, controller 61 can close disable switch 64, thereby, pulling pin 63 down to ground to cause the driver 62 to turn off the isolation switch. Thus, in some embodiments, driver 62 may open undervoltage switch 65 (i.e., set high) to indicate the undervoltage condition and pull pin 63 to $V_{OLF}$. When the pin 63 is pulled to $V_{OLF}$, the ACTIVE signal output of driver 62 may be turned off.

Between points E and F, when charge pump voltage Vcp rises above the undervoltage threshold, Vcpon, driver 62 can close undervoltage switch 65 to indicate the undervoltage fault condition has cleared and thus pulling pin 63 above a predetermined threshold level (e.g., 1.1V). Controller 61 may respond to the fault condition clearing by turning off the disable switch 64, thereby causing the ENA pin 63 to be pulled high and the ACTIVE signal output of driver 62 to go high and turn on the switch.

Between points F and G, during a power off phase, the main power supply VBAT may be turned off. As the VBAT drops, the voltage at the charge pump, Vcp, drops as well. When Vcp falls below the undervoltage threshold Vcpon, an undervoltage condition is detected and undervoltage switch 65 is again closed, thereby pulling pin 63 (ENA) below to fault indication threshold level $V_{OLF}$. Controller 61 may recognize the fault indication at pin 63 and generate command signals to turn off the switch coupled to driver 62. In response, driver 62 can turn off, thus the ACTIVE signal output is off and the switch coupled to driver 62 is turned off.

Between points G and H, the controller 61 may generate commands to enable the switch coupled to driver 62. Controller 61 can open disable switch 64 to pull pin 63 above a predetermined threshold level, thereby causing the ENA pin 63 to be pulled up and the ACTIVE signal to go high to turn on the isolation switch.

Figure 7:
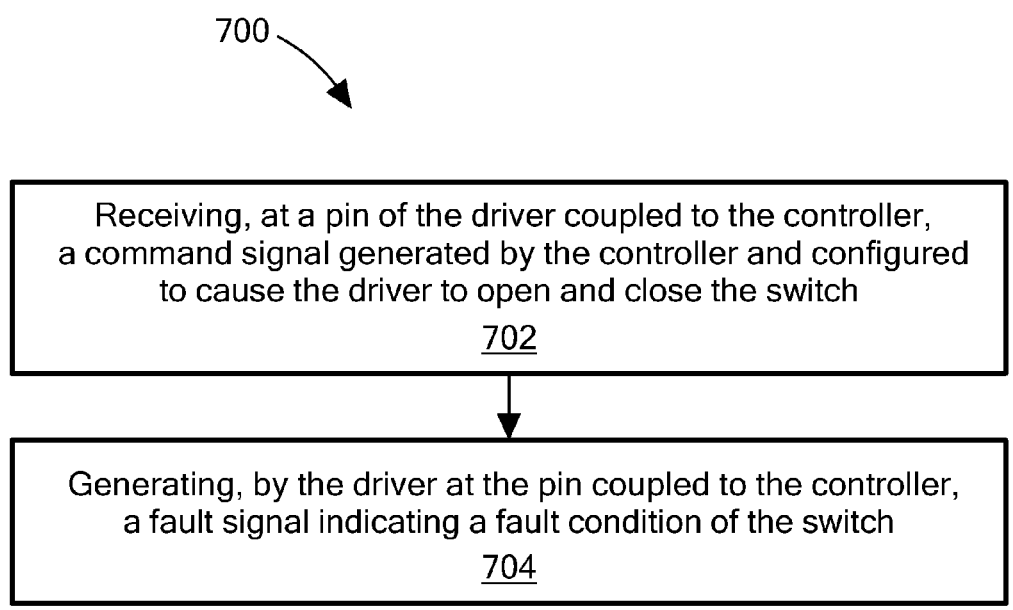
FIG. 7 is a flow diagram of a method for the signaling schemes of FIGS. 5-6B.

Now referring to FIG. 7, a flow diagram of a method for signaling between a controller and a driver, such as an isolator driver of FIGS. 5 and 6, is shown. At step 702, a pin of the driver coupled to the controller receives a command signal generated by the controller. The driver can be configured for driving a switch (e.g., isolation switch) and the command signal can be configured to cause the driver to open the switch when the command signal is in a first state and to close the switch when the command signal is in a second state. In some embodiments, the first state may refer to the switch being in the ON state and the second state may refer to the switch being in the OFF state.

The controller may command the driver to drive the switch from the first state to the second state or vice versa in response to a voltage detected at a gate terminal or source terminal of the switch. More particularly, in response to a fault indication (e.g., a fault signal 38 as may be generated by a voltage monitor circuit 22a of FIG. 3), the controller may command the driver to open the respective switch since the fault indication may indicate an undervoltage condition of the VGS voltage of the switch and thus, an unsafe condition in which to operate the motor.

At step 704, the driver, at a pin coupled to the controller, generates a fault signal indicating a fault condition. In some embodiments, the fault signal is generated simultaneously with receiving the command signal. The fault signal may be generated in response to the voltage detected at a gate terminal or source terminal of the switch.

All references cited herein are hereby incorporated herein by reference in their entirety. Having described preferred embodiments of the invention, it will now become apparent to one of ordinary skill in the art that other embodiments incorporating their concepts may be used.

It is felt therefore that these embodiments should not be limited to disclosed embodiments, but rather should be limited only by the spirit and scope of the appended claims.

What is claimed:

1. A method for signaling between a controller and a driver, the method comprising:
   receiving, at a pin of the driver coupled to the controller, a command signal generated by the controller, wherein the command signal is configured to cause the driver to open a switch when the command signal is in a first state and to close the switch when the command signal is in a second state; and
   generating, by the driver at the pin coupled to the controller, a fault signal indicating a fault condition of the switch, wherein generating the fault signal can occur substantially simultaneously with receiving the command signal, wherein the command signal being in the first state corresponds to the command signal having a voltage level above a first predetermined threshold and wherein the command signal being in the second state corresponds to the command signal having a voltage level below a second predetermined threshold and wherein the fault signal has a voltage level above the first predetermined threshold or below the second predetermined threshold.

2. A method for signaling between a controller and a driver for driving a switch, the method comprising:
   receiving, at a pin of the driver coupled to the controller, a command signal generated by the controller and configured to cause the driver to open the switch when the command signal is in a first state and to close the switch when the command signal is in a second state; and
   generating, by the driver at the pin coupled to the controller, a fault signal indicating a fault condition of the switch, wherein the command signal being in the first state corresponds to the command signal having a voltage level above a first predetermined threshold and wherein the command signal being in the second state corresponds to the command signal having a voltage level below a second predetermined threshold and wherein the fault signal has a voltage level above the first predetermined threshold or below the second predetermined threshold.

3. The method of claim 2, wherein generating the fault signal can occur substantially simultaneously with receiving the command signal.

4. A driver for driving a field effect transistor, comprising:
   a gate drive circuit coupled to a gate terminal of the field effect transistor to control conduction of the field effect transistor in response to a command signal received at a pin of the driver; and
   a monitor circuit configured to monitor a voltage associated with the field effect transistor and to generate a fault signal at the pin if the voltage meets a predetermined condition, wherein the command signal is configured to be in a first state corresponding to a voltage level greater than a first predetermined level to cause the field effect transistor to conduct or in a second state corresponding to a voltage level less than a second predetermined level to cause the field effect transistor to cease conduction and wherein the fault signal has a voltage level greater the first predetermined threshold or less than the second predetermined threshold.

5. The driver of claim 4, wherein the fault signal can be generated substantially simultaneously with the command being received.

6. The driver of claim 4, wherein the command signal is generated by a controller coupled to the pin of the driver.

7. The driver of claim 4, wherein the monitor circuit is configured to monitor the voltage between the gate terminal and a source terminal of the field effect transistor.

8. The driver of claim 7, wherein the predetermined condition is an undervoltage condition between a gate terminal and a source terminal of the field effect transistor.

* * * * *